US009812564B1

(12) United States Patent
Liu et al.

(10) Patent No.: US 9,812,564 B1
(45) Date of Patent: Nov. 7, 2017

(54) SPLIT-GATE MOSFET

(71) Applicant: Silicongear Corporation, Hsinchu County (TW)

(72) Inventors: Chih-Cheng Liu, Hsinchu County (TW); Jiong-Guang Su, Hsinchu County (TW); Hung-Wen Chou, Hsinchu County (TW)

(73) Assignee: Silicongear Corporation, Hsinchu County (TW)

( * ) Notice: Subject to any disclaimer, the term of this patent is extended or adjusted under 35 U.S.C. 154(b) by 0 days.

(21) Appl. No.: 15/340,997

(22) Filed: Nov. 2, 2016

(30) Foreign Application Priority Data

Aug. 25, 2016 (TW) .............................. 105127204 A

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0642* (2013.01); *H01L 29/4236* (2013.01); *H01L 29/4238* (2013.01); *H01L 29/66734* (2013.01)

(58) Field of Classification Search
CPC ............. H01L 29/7813; H01L 29/0642; H01L 29/4236; H01L 29/4238; H01L 29/66734
See application file for complete search history.

(56) References Cited

U.S. PATENT DOCUMENTS 4,864,374 A * 9/1989 Banerjee ............... H01L 27/108
257/300
5,945,708 A * 8/1999 Tihanyi ............... H01L 29/4175
257/327
(Continued)

FOREIGN PATENT DOCUMENTS

TW 201244106 11/2012
TW 201246496 11/2012
(Continued)

OTHER PUBLICATIONS

"Office Action of Taiwan Counterpart Application," dated Apr. 19, 2017, p. 1-p. 7.

*Primary Examiner* — Ida M Soward
(74) *Attorney, Agent, or Firm* — JCIPRNET

(57) ABSTRACT

A split-gate MOSFET includes first and second epitaxial layers, first, second, and third gates, a gate oxide layer, a trench oxide layer, and a trench implantation region formed on a substrate in order. The second epitaxial layer has a doping concentration greater than that of the first epitaxial layer. A plurality of trenches is in the first and second epitaxial layers. Both the first and second gates are located in each of the trenches in a cell region. The third gates are located in each of the trenches in a terminal region. The third gate closest to the cell region is grounded, and the others are floating. The gate oxide layer is disposed between the first and second gates. The trench oxide layer is located between the first gate and the first epitaxial layer and located between the trench surface and the third gate. The trench implantation
(Continued)

region is located in the first epitaxial layer at the bottom of the trench and has a doping concentration less than that of the first epitaxial layer.

11 Claims, 13 Drawing Sheets

(51) Int. Cl.
*H01L 29/66* (2006.01)
*H01L 29/423* (2006.01)

(56) References Cited

U.S. PATENT DOCUMENTS

| | | | | |
|---|---|---|---|---|
| 5,998,821 | A * | 12/1999 | Hieda | H01L 27/10861 257/296 |
| 6,781,191 | B2 * | 8/2004 | Lin | H01L 21/26586 257/321 |
| 7,745,878 | B2 * | 6/2010 | Bhalla | H01L 29/407 257/330 |
| 7,929,321 | B2 * | 4/2011 | Hshieh | H01L 21/823412 257/341 |
| 8,143,124 | B2 * | 3/2012 | Challa | H01L 21/3065 257/341 |
| 8,384,194 | B2 * | 2/2013 | Hsieh | H01L 29/0626 257/565 |
| 8,569,780 | B2 * | 10/2013 | Hsieh | H01L 29/66106 257/139 |
| 8,610,235 | B2 * | 12/2013 | Calafut | H01L 27/06 257/471 |
| 8,735,249 | B2 * | 5/2014 | Tsai | H01L 29/0882 257/E29.26 |
| 8,809,933 | B2 * | 8/2014 | Lee | H01L 21/743 257/316 |
| 8,896,093 | B2 * | 11/2014 | Mallikararjunaswamy | H01L 27/0248 257/531 |
| 9,214,534 | B2 * | 12/2015 | Mallikarjunaswamy | H01L 21/761 |
| 9,230,851 | B2 * | 1/2016 | Molloy | H01L 29/66348 |
| 9,312,335 | B2 * | 4/2016 | Mallikarjunaswamy | H01L 29/735 |
| 9,614,043 | B2 * | 4/2017 | Azam | H01L 29/7811 |
| 2004/0195620 | A1 * | 10/2004 | Chuang | H01L 29/402 257/335 |
| 2005/0275002 | A1 * | 12/2005 | Shone | H01L 21/28273 257/296 |
| 2010/0044796 | A1 * | 2/2010 | Hshieh | H01L 21/823475 257/365 |
| 2011/0210406 | A1 * | 9/2011 | Terrill | H01L 29/407 257/412 |
| 2012/0211828 | A1 * | 8/2012 | Bobde | H01L 29/407 257/330 |
| 2012/0220092 | A1 * | 8/2012 | Bobde | H01L 29/407 438/270 |
| 2012/0292696 | A1 * | 11/2012 | Park | H01L 29/407 257/334 |
| 2015/0357461 | A1 * | 12/2015 | Kawahara | H01L 29/7811 257/329 |
| 2016/0043072 | A1 * | 2/2016 | Vielemeyer | H01L 27/0629 327/109 |
| 2016/0133742 | A1 * | 5/2016 | Okuda | H01L 29/7813 257/330 |
| 2016/0260814 | A1 * | 9/2016 | Yilmaz | H01L 29/66666 |
| 2016/0343709 | A1 * | 11/2016 | Kim | H01L 27/0886 |
| 2017/0133473 | A1 * | 5/2017 | Lee | H01L 29/4236 |
| 2017/0186844 | A1 * | 6/2017 | Kim | H01L 27/10823 |

FOREIGN PATENT DOCUMENTS

| | | |
|---|---|---|
| TW | 201251012 | 12/2012 |
| TW | 201611125 | 3/2016 |
| TW | 201611183 | 3/2016 |

* cited by examiner

SPLIT-GATE MOSFET

CROSS-REFERENCE TO RELATED APPLICATION

This application claims the priority benefit of Taiwan application serial no. 105127204, filed on Aug. 25, 2016. The entirety of the above-mentioned patent application is hereby incorporated by reference herein and made a part of this specification.

BACKGROUND OF THE INVENTION

Field of the Invention

The invention relates to a trench MOSFET, and more particularly, to a split-gate MOSFET.

Description of Related Art

The split-gate MOSFET is also referred to as a shielded-gate MOSFET, and the structure thereof divides the gate structure in a trench MOSFET into two electric potentials by isolating via an inter-poly-dielectric (IPD) layer. The gate located above is used for forming a channel of the MOSFET, and the gate located below is electrically coupled to a source potential via a metal interconnect for the generation of two-dimensional charge balance under blocking operation, and excessive gate-to-source capacitance in a traditional trench MOSFET is reduced via the IPD layer, so as to reduce switching loss.

However, as the high-voltage application reaches 100 V or above, a trench oxide layer greater than 8000 Angstroms not only significantly increases the cell pitch of the MOSFET, but also increases the cell resistance. Moreover, forming such a thick trench oxide layer is more costly and requires longer cyclical deposition time, and due to thermal oxide growth process, the corners of the trench oxide layer close to the bottom of the trench are thinner, and as a result adverse effects are occurred.

SUMMARY OF THE INVENTION

The invention provides a split-gate MOSFET. The effect of the split-gate MOSFET can be maintained in a high-voltage field.

The split-gate MOSFET of the invention at least has a terminal region and a cell region. The split-gate MOSFET includes a substrate, first and second epitaxial layers, a plurality of first, second, and third gates, a gate oxide layer, a trench oxide layer, and a trench implantation region. The first epitaxial layer is formed on the substrate and has a first doping concentration. The second epitaxial layer is formed on the first epitaxial layer, wherein the second epitaxial layer has a second doping concentration greater than the first doping concentration. A plurality of trenches is in the first and the second epitaxial layers, and the trenches pass through the second epitaxial layer and are extended into the first epitaxial layer. The first and second gates are both located within each of the trenches in the cell region, wherein the second gate is located on the first gate. The third gates are respectively located in each of the trenches in the terminal region, wherein the third gate closest to the cell region is grounded and the rest of the third gates are floating gates. The gate oxide layer is located between the first and second gates and located between the second gate and the second epitaxial layer. The trench oxide layer is located between the first gate and the first epitaxial layer and located between the surface of the trench and the third gate in the terminal region. The trench implantation region is located in the first epitaxial layer at the bottom of each of the trenches in the cell region and the terminal region, wherein the trench implantation region has a third doping concentration less than the first doping concentration.

In an embodiment of the invention, the trench implantation region can cover the bottom of each of the trenches.

In an embodiment of the invention, the interface of the first and second epitaxial layers can be adjacent to the trench implantation region.

In an embodiment of the invention, the interface of the first and second epitaxial layers can be in contact with the trench implantation region.

In an embodiment of the invention, the thickness of the gate oxide layer can be less than the thickness of the trench oxide layer.

In an embodiment of the invention, the width of the second gate can be greater than the width of the first gate.

In an embodiment of the invention, the second gate can further include an extending portion extended to the sidewall of the first gate.

In an embodiment of the invention, the conductive state of the first and second epitaxial layers is, for instance, n-type.

In an embodiment of the invention, the split-gate MOSFET can further include a p-type well on the second epitaxial layer.

In an embodiment of the invention, the interface of the p-type well and the second epitaxial layer can be adjacent to the gate oxide layer between the first and second gates.

In an embodiment of the invention, the third gate closest to the cell region and the p-type well in the cell region are equipotential.

Based on the above, in the invention, via two epitaxial layers having different doping concentrations and the implantation region at the bottom of each trench, the width of the depletion region for high-voltage application can be maintained and the resistance of the split-gate MOSFET can be reduced at the same time. Moreover, maximum electric field at the corners of the trench can also be released.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The figures in the following embodiments are intended to more comprehensively describe the exemplary embodiments of the inventive concept, but the invention can still be implemented in many different forms, and the invention should not be construed as limited to the recited embodiments. In the figures, for clarity, the relative thickness and location of film layers, regions, and/or structural devices may be reduced or enlarged. Moreover, in the present specification, "first", "second", "third" . . . etc. are used to describe different regions, film layers, and/or blocks, but such terms are only intended to differentiate a region, film layer, or block from another region, film layer, or block. Therefore, a first region, film layer, or block discussed below can be referred to as a second region, film layer, or block without compromising the teaching of the embodiments.

Figure 1:
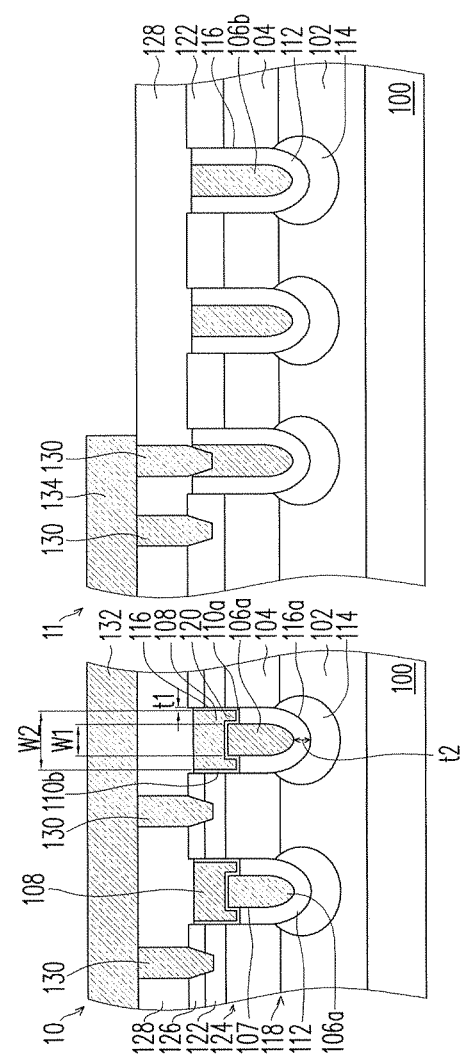
FIG. 1 is a cross-sectional schematic of a split-gate MOSFET according to an embodiment of the invention.

FIG. 1 is a cross-sectional schematic of a split-gate MOSFET according to an embodiment of the invention.

Referring to FIG. 1, the split-gate MOSFET of the present embodiment at least has a cell region 10 and a terminal region 11 including a substrate 100, a first epitaxial layer 102, a second epitaxial layer 104, a first gate 106a, a second gate 108, a third gate 106b, gate oxide layers 110a to b, a trench oxide layer 112, and a trench implantation region 114. In particular, the first epitaxial layer 102 is formed on the substrate 100, and the first epitaxial layer 102 has a first doping concentration; the second epitaxial layer 104 is formed on the first epitaxial layer 102, wherein the second epitaxial layer 104 has a second doping concentration greater than the first doping concentration sufficient to reduce the resistance of the cell region 10 of the split-gate MOSFET such that the turn-on current ($RD_{SON}$) may be reduced. The conductive type of the first epitaxial layer 102 and the second epitaxial layer 104 is, for instance, n-type. A plurality of trenches 116 is in the first epitaxial layer 102 and the second epitaxial layer 104, and the trenches 116 pass through the second epitaxial layer 104 and are extended in the first epitaxial layer 102. The first gate 106a and the second gate 108 are both located within the trenches 116 of the cell region 10, wherein the second gate 108 is located on the first gate 106a. The third gates 106b are respectively located in each of the trenches 116 in the terminal region 11, wherein the third gate 106b closest to the cell region 10 is grounded (GND), and the rest of the third gates 106b are floating gates. The first gate 106a and the third gate 106b are preferably formed by the same deposition process, and therefore the same reference numerals are used in the figure to represent gates located at different regions. In an embodiment, the number of the trench 116 having the third gate 106b in the terminal region 11 is, for instance, 2 to 4, but the number can be increased as needed. Moreover, the gate oxide layer 110a is located between the first gate 106a and the second gate 108 and the gate oxide layer 110b is located between the second gate 108 and the second epitaxial layer 104, the gate oxide layers 110a and 110b are generally the same film layer formed by the same process, and two reference numerals are adopted here to represent gate oxide layers located at different regions. The trench oxide layer 112 is located between the first gate 106a and the first epitaxial layer 102 and located between the surface of the trench 116 and the third gate 106b in the terminal region 11.

Referring further to FIG. 1, the trench implantation region 114 is located in the first epitaxial layer 102 of a bottom 116a of each of the trenches 116, wherein the trench implantation region 114 has a third doping concentration, and the third doping concentration is less than the first doping concentration of the first epitaxial layer 102. In the case that the first and second epitaxial layers 102 and 104 are n-type, in the trench implantation region 114, the doping concentration of the first epitaxial layer 102 of the bottom 116a of the trench 116 is generally reduced by implanting a dopant (such as boron) having the opposite conductive type (p-type). Since the trench implantation region 114 for which the doping concentration is reduced has a greater resistance, if the trench implantation region 114 in the cell region 10 can cover the bottom 116a of each of the trenches 116, then the release of maximum electric field at the corners of the trench can be facilitated. Moreover, an interface 118 of the first epitaxial layer 102 and the second epitaxial layer 104 can be in contact with the trench implantation region 114 or slightly higher than the trench implantation region 114. In the present embodiment, a thickness t1 of the gate oxide layers 110a to b is generally less than a thickness t2 of the trench oxide layer 112, and since the first doping concentration of the first epitaxial layer 102 is low enough and does not need to be the same as the second doping concentration of the second epitaxial layer 104, a width of a depletion region for high-voltage application can be maintained, and the thickness t2 of the trench oxide layer 112 does not need to be increased due to the application of high-voltage field. As a result, the cell pitch of the cell region 10 of the split-gate MOSFET can be reduced and therefore higher breakdown voltage (BVDSS) can be achieved. A width w2 of the second gate 108 can be greater than a width w1 of the first gate 106a as shown in FIG. 1, or the two can be the same. When the width w2 of the second gate 108 is greater than the width w1 of the first gate 106a, the second gate 108 can further include an extending portion 120 extended to a sidewall 107 of the first gate 106a.

Referring further to FIG. 1, in the split-gate MOSFET, a p-type well 122 can be further included on the second epitaxial layer 104, wherein an interface 124 of the p-type well 122 and the second epitaxial layer 104 can be adjacent to the gate oxide layer 110a between the first gate 106a and the second gate 108, such as level with or slightly lower or slightly higher than the gate oxide layer 110a. The p-type well 122 in the terminal region 11 is located between the trenches 116. Moreover, a source doped region 126 of the cell region 10 of the general split-gate MOSFET can be electrically connected to a conductive layer 132 above via vias 130 located in an insulation layer 128, wherein the conductive layer 132 is, for instance, a metal layer. The surface of the first epitaxial layer 102 is not formed in the substrate 100 on the drain portion of the cell region 10 of the split-gate MOSFET, which is prior art and is not repeated herein. Moreover, the third gate 106b in the terminal region 11 closest to the cell region 10 and the p-type well 122 in the cell region 10 can be equipotential, and therefore, as shown in FIG. 1, the effect of equipotential of the third gate 106b and the p-type well 122 can be achieved via the vias 130 located in the insulation layer 128 and the conductive layer 134 above the vias 130. However, the invention is not limited thereto, and other designs can also be adopted to achieve the effect.

FIG. 2A to FIG. 2H are cross-sectional schematics of the manufacturing process of a split-gate MOSFET according to another embodiment of the invention.

Figure 2A:
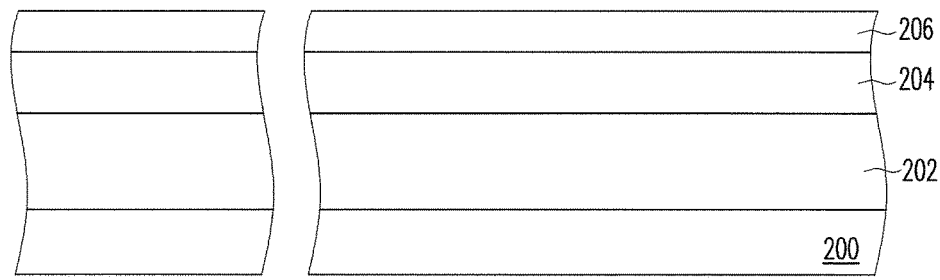
FIG. 2A to FIG. 2H are cross-sectional schematics of the manufacturing process of a split-gate MOSFET according to another embodiment of the invention.

Referring to FIG. 2A, a first epitaxial layer 202 is first simultaneously formed on a substrate 200 of a cell region 20 and a terminal region 21, and then a second epitaxial layer 204 is formed, wherein the processes of the first epitaxial layer 202 and the second epitaxial layer 204 are similar, wherein a bigger difference is that the doping concentration of the second epitaxial layer 204 is greater than the doping concentration of the first epitaxial layer 202. Next, an entire mask layer 206 is formed to cover the second epitaxial layer 204.

Figure 2B:
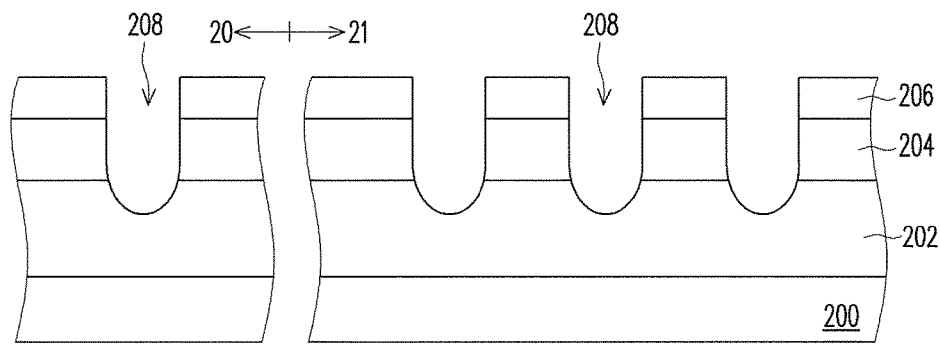

Then, referring to FIG. 2B, the mask layer 206 is patterned to expose the portion in which a trench 208 is to be formed, and then the mask layer 206 is used as an etch mask. The etching passes through the second epitaxial layer 204 and continues in the first epitaxial layer 202 to form the trench 208.

Figure 2C:
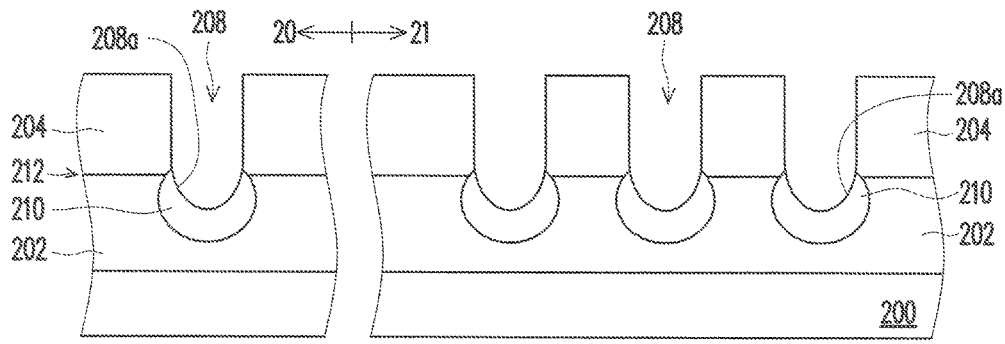

Next, referring to FIG. 2C, a trench implantation step is performed to form a trench implantation region 210 in the first epitaxial layer 202 of a bottom 208a of each of the trenches 208. If the first epitaxial layer 202 is n-type, then a p-type dopant (such as boron) is used in the trench implantation step to reduce the concentration of a portion of the first epitaxial layer 202. Therefore, the doping concentration of the trench implantation region 210 is less than the doping concentration of the first epitaxial layer 202. In the present embodiment, an interface 212 of the first and second epitaxial layers 202 and 204 is in contact with the trench implantation region 210, but the invention is not limited thereto. Then, the mask layer 206 shown in FIG. 2B can be removed.

Figure 2D:
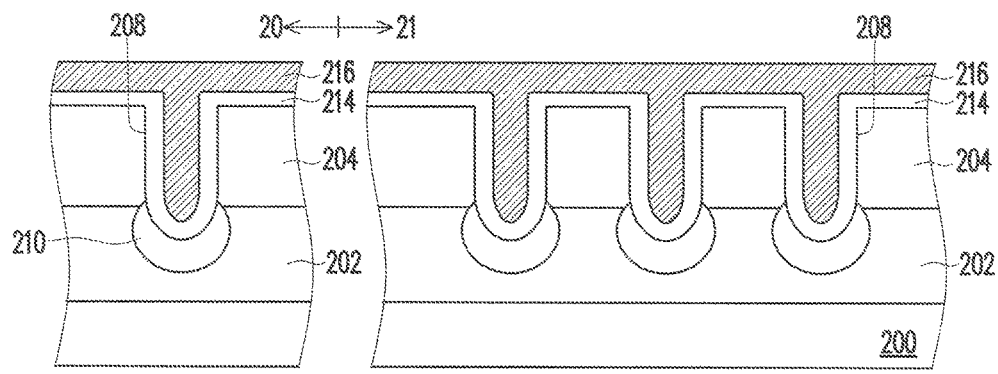

Next, referring to FIG. 2D, thermal oxidation is performed to form an oxide layer 214 on the surface exposed by the first and second epitaxial layers 202 and 204 (i.e., the surface of the trench 116), and then a conductive layer 216 is comprehensively deposited on the substrate 200.

Figure 2E:
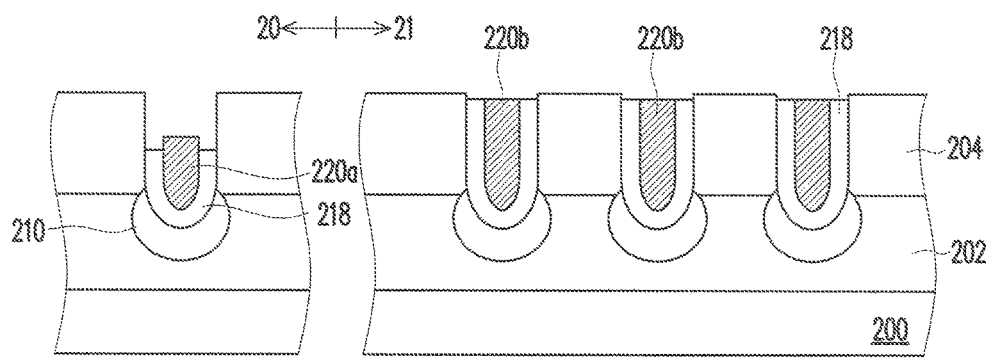

Next, referring to FIG. 2E, the conductive layer 216 of FIG. 2D can be first planarized via CMP to expose the oxide layer 214 of FIG. 2D, and then a portion of the oxide layer is removed by wet etching to leave the portion used as the trench oxide layer 218, wherein the height of the trench oxide layer 218 of the cell region 20 can be made less than the height of the trench oxide layer 218 of the terminal region 21 by, for instance, controlling the length of the etching time and using an etch mask (not shown). Next, the exposed portion of the conductive layer is removed to respectively obtain a first gate 220a and a third gate 220b. When the first gate 220a is slightly protruding as shown in the figure, the subsequently-formed structure can cover the top of the first gate 220a.

Figure 2F:
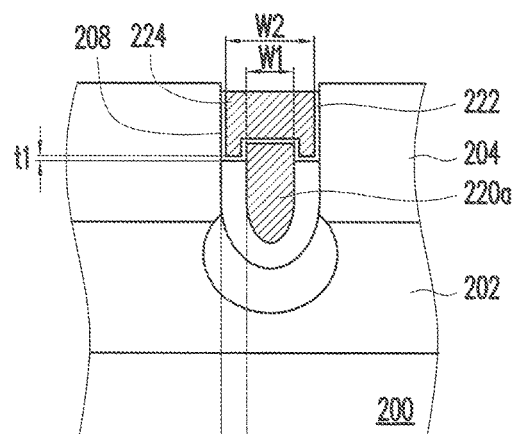

Next, referring to FIG. 2F, a gate oxide layer 222 and a second gate 224 are formed on the surface of the trench 208 of the cell region and on the first gate 220a in the trench 208, and the manufacturing methods of the gate oxide layer 222 and the second gate 224 are as shown in the method of FIG. 2D to FIG. 2E. A thickness t1 of the gate oxide layer 222 is generally less than a thickness t2 of the trench oxide layer 218, and a width w2 of the second gate 224 can be greater than a width w1 of the first gate 220a.

Figure 2G:
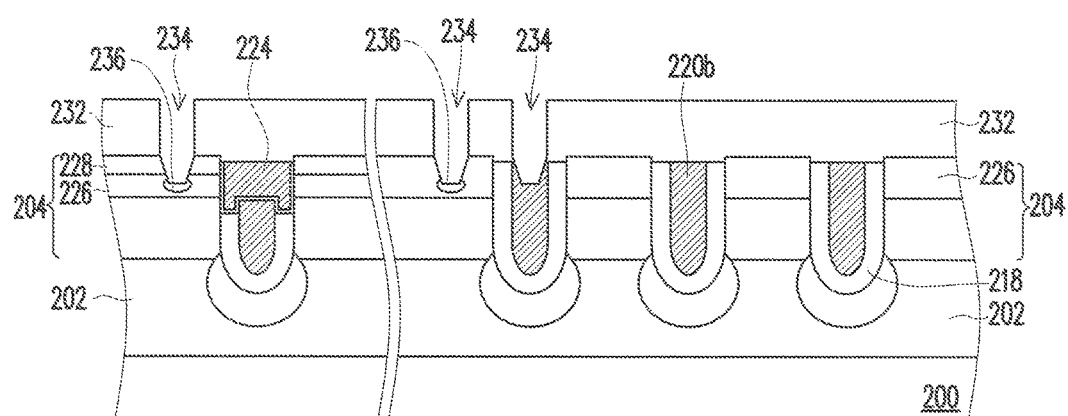

Next, referring to FIG. 2G, a p-type well 226 is comprehensively formed on the surface of the second epitaxial layer 204 of the cell region 20 and the terminal region 21 via a plurality of doping steps. The doping steps are, for instance, a first p-type doping step in which the dose is low and the energy is low, a second p-type doping step in which the dose is medium and the energy is medium, and a third p-type doping step in which the dose is high and the energy is high. Next, an n-type doping step can be additionally performed in the cell region 20 to form a source doped region 228, and a drain doped region (not shown) can also be formed on the other side of the substrate 200. Next, an insulation layer 232 is formed to cover the entire cell region 20 and the terminal region 21, and a plurality of via openings 234 passing through the insulation layer 232 is formed, wherein the via openings 234 in the cell region 20 can further pass through the source doped region 228 and be extended to the p-type well 226, and the via openings 234 in the terminal region 21 can be further extended to the p-type well 226 or extended to the third gate 220b closest to the cell region 20. Next, a p+ doped region 236 can be optionally formed in the via openings 234.

Figure 2H:
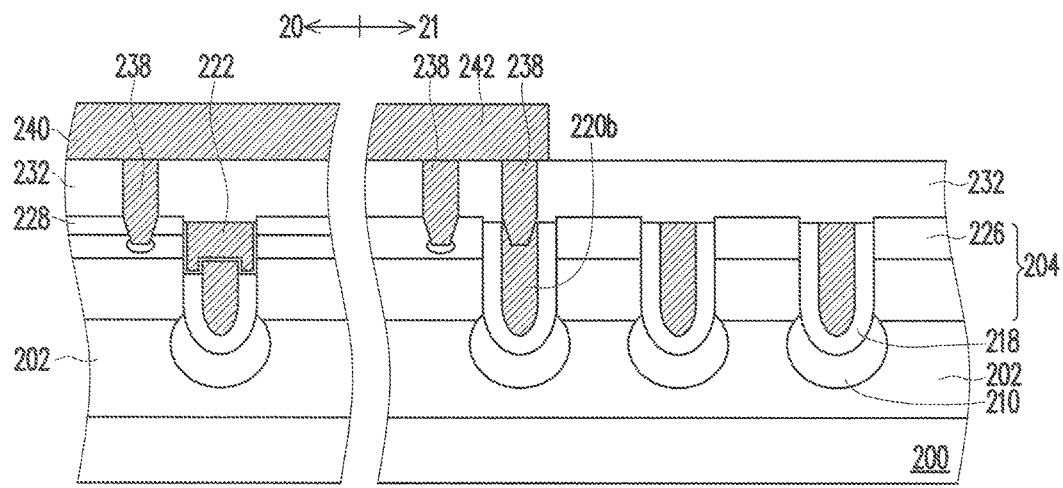

Lastly, referring to FIG. 2H, vias 238 are formed in the via openings 234, and then conductive layers 240 and 242 connected to the vias 238 are formed on the insulation layer 232, wherein the conductive layers 240 and 242 can be metal layers.

To verify the effects of the invention, several simulation experiments are provided below, but the scope of the invention is not limited to the following experiments.

Simulation target 1: the cell region of the split-gate MOSFET of the invention, wherein the thickness of the first epitaxial layer is about 4.5 microns and the phosphorous dopant amount is 7e15 ions/cm$^2$; the thickness of the second epitaxial layer is about 5 microns and the phosphorous dopant amount is 3.1e16 ions/cm$^2$; the boron dopant amount of the trench implantation region is 5e12 ions/cm$^2$.

Simulation target 2: the cell region of the split-gate MOSFET of a control group, wherein the trench implantation region of simulation target 1 is omitted, and only one epitaxial layer having a thickness of about 9.5 microns and a phosphorous dopant amount of 3.1e16 ions/cm$^2$ is included, and the rest are all the same as simulation target 1.

Simulation target 3: the terminal region of the split-gate MOSFET of the invention having 3 trenches, and the gate closest to the cell region and the p-type well are equipotential, and the rest of the gates are floating gates. The other parameters are the same as those of simulation target 1.

Simulation Results

Figure 3:
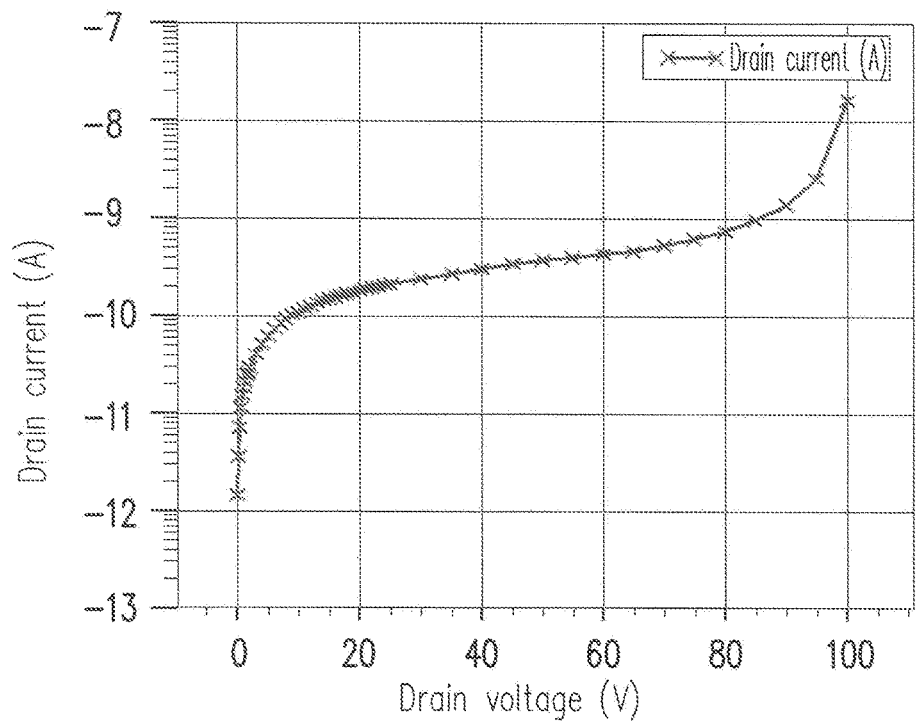
FIG. 3 is a current-voltage curve of the drain of simulation target 2.
Figure 4:
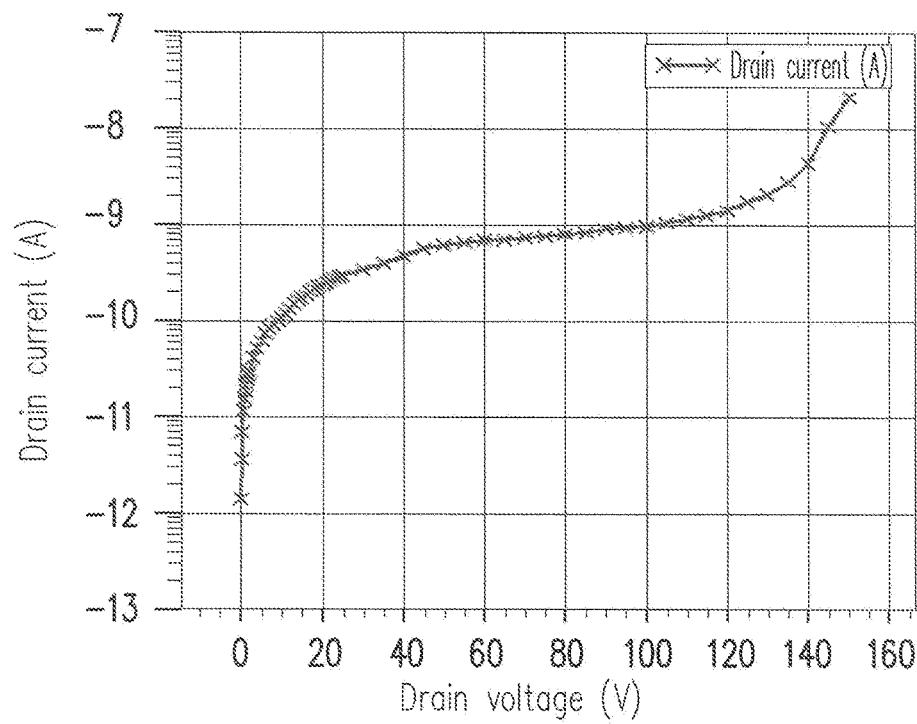
FIG. 4 is a current-voltage curve of the drain of simulation target 1.

FIG. 3 is a current-voltage curve of the drain of simulation target 2, and FIG. 4 is a current-voltage curve of the drain of simulation target 1. It can be known from the comparison of FIG. 3 and FIG. 4 that, the split-gate MOSFET of the invention can be applied in a voltage field of 100 V or above.

Figure 5:
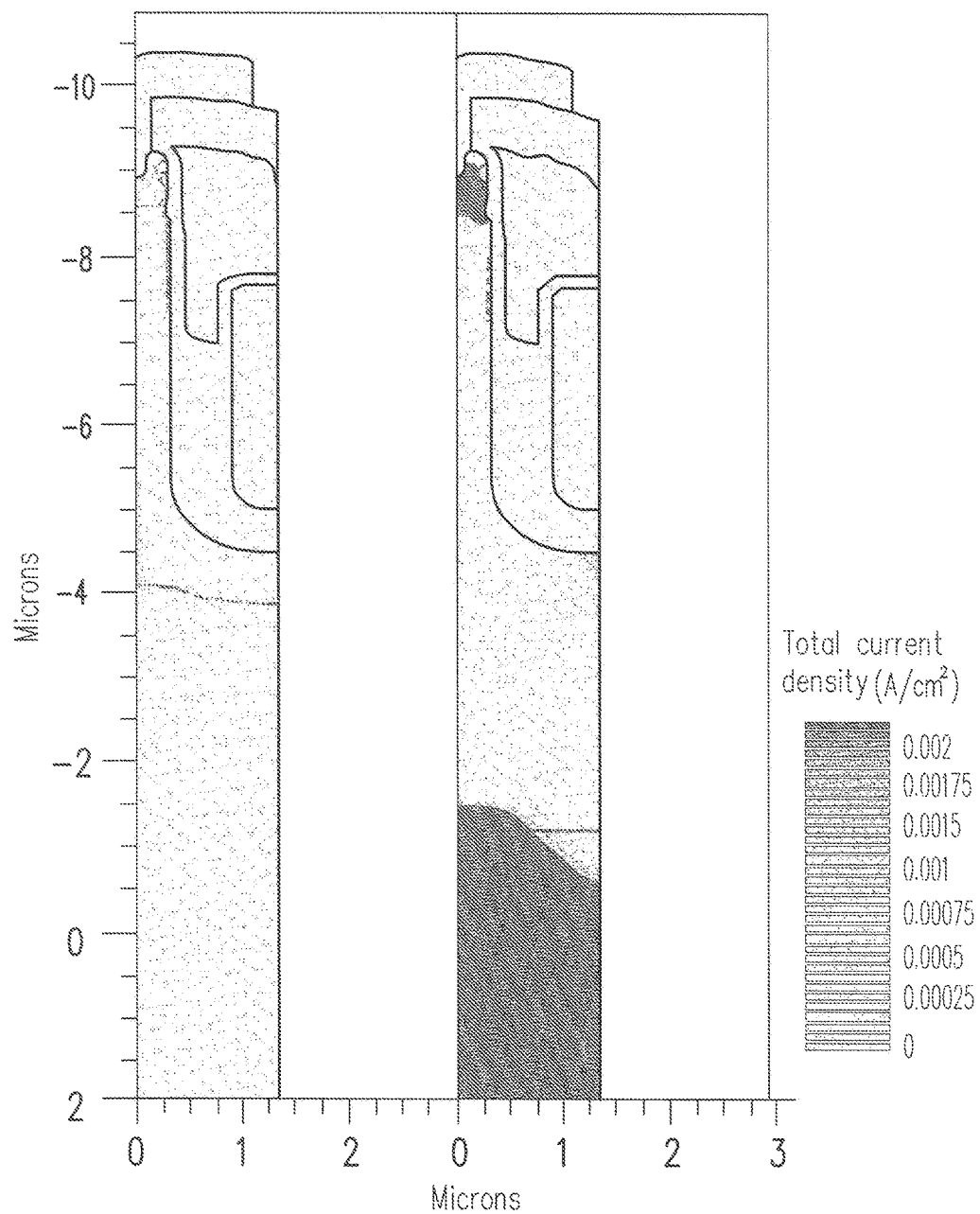
FIG. 5 is a graph of the distribution of total current density of simulation target 1 and simulation target 2.

The left side of FIG. 5 is a graph of the distribution of total current density of simulation target 2, and the right side of FIG. 5 is a graph of the distribution of total current density (unit: A/cm$^2$) of simulation target 1. It can be known from FIG. 5 that, the current density of the split-gate MOSFET of the invention is higher.

Figure 6:
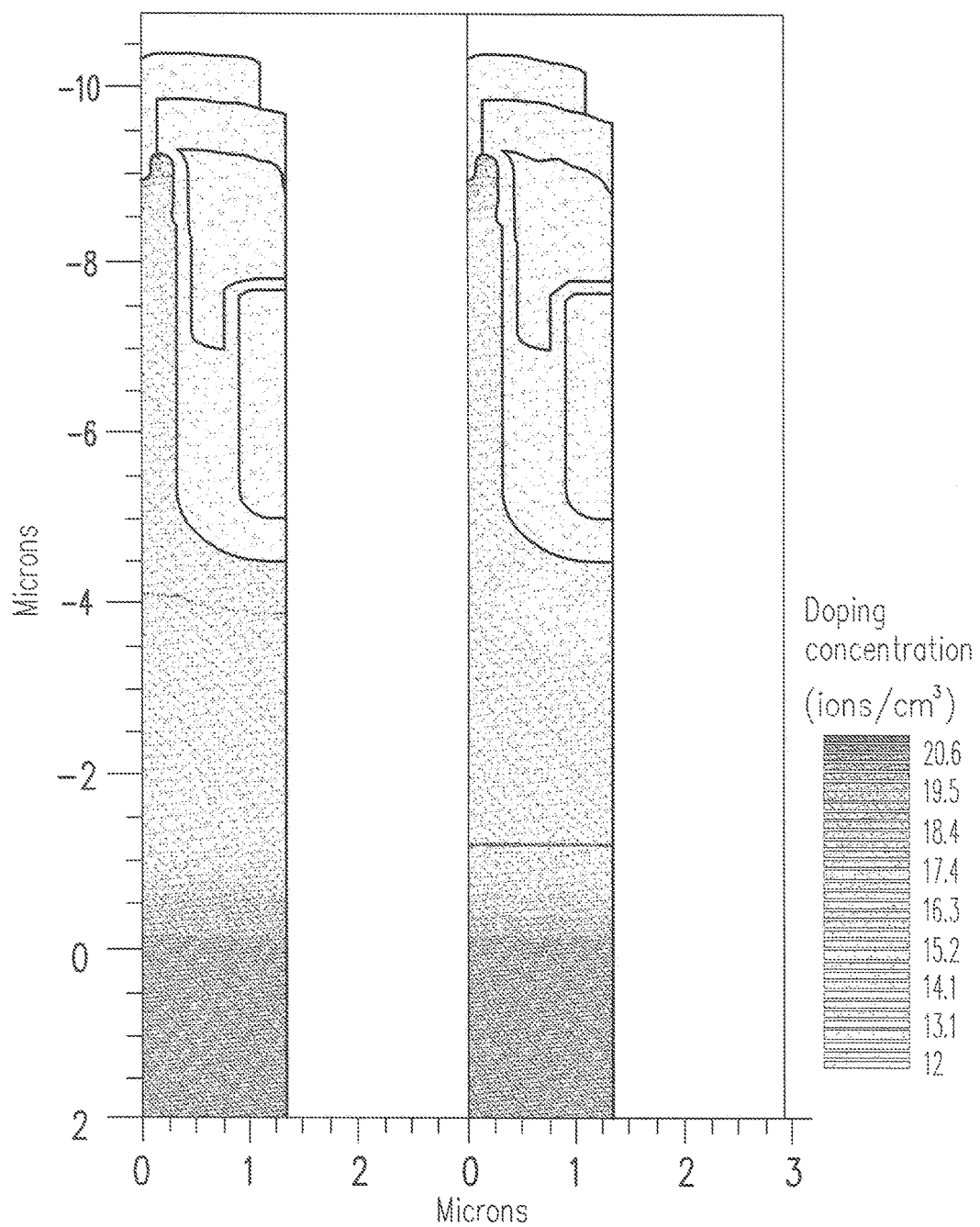
FIG. 6 shows graphs of the distribution of doping concentration of simulation target 1 and simulation target 2.

The left side of FIG. 6 is a graph of the distribution of doping concentration of simulation target 2, and the right side of FIG. 6 is a graph of the distribution of doping concentration of simulation target 1 (unit: ions/cm$^3$) (the numeric value in FIG. 6 is the value of n of $10^n$). It can be seen from FIG. 6 that, the bottom of the trench of the split-gate MOSFET of the invention has a region having lower doping concentration, and the doping concentration of the epitaxial layer in the periphery of the trench is higher than the doping concentration of the epitaxial layer below the trench.

Figure 7:
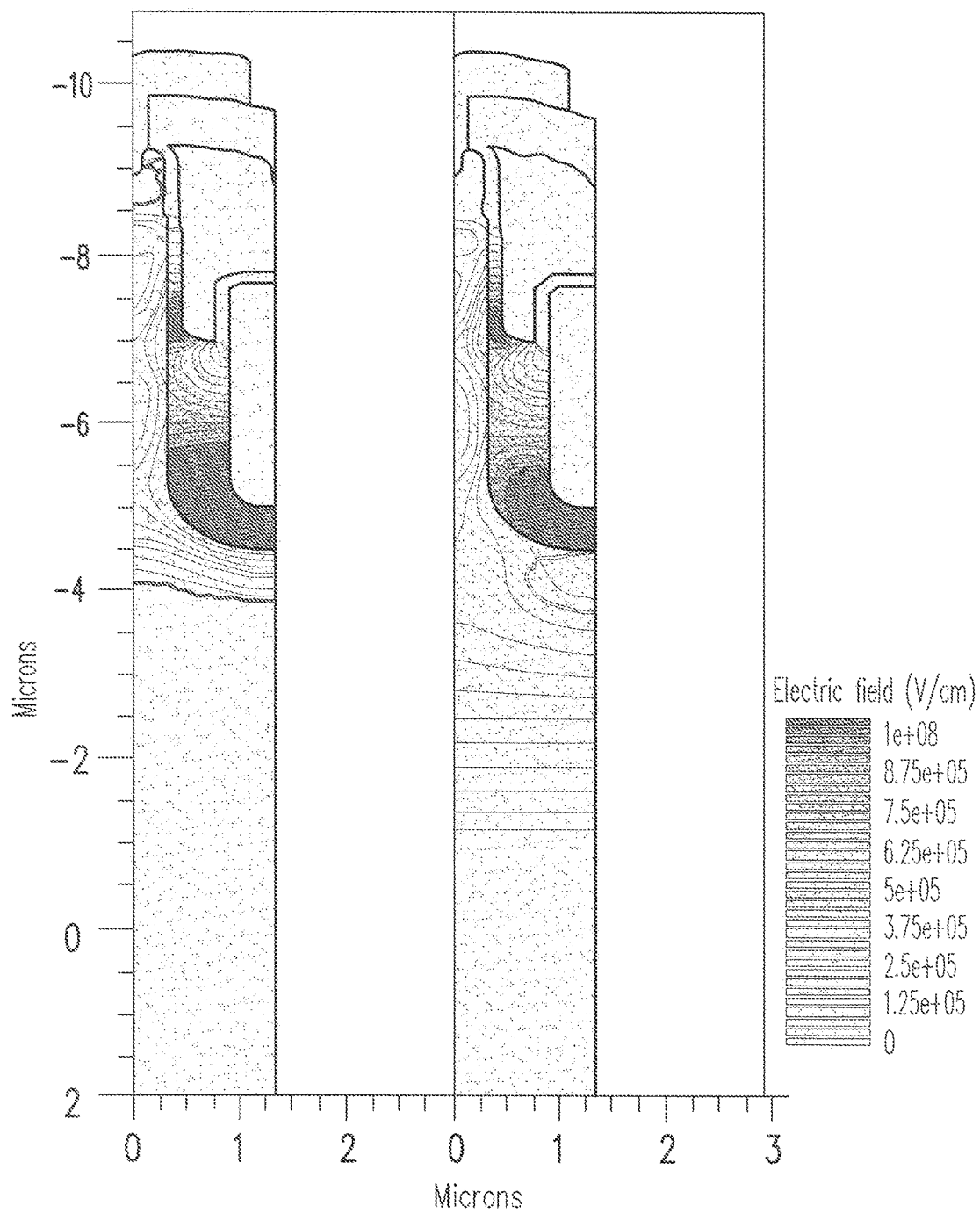
FIG. 7 shows graphs of the distribution of electric field of simulation target 1 and simulation target 2.

The left side of FIG. 7 is a graph of the distribution of electric field of simulation target 2, and the right side of FIG. 7 is a graph of the distribution of electric field of simulation target 1. It can be known from FIG. 7 that, the split-gate MOSFET of the invention can prevent high potential at the corners of the trench.

Figure 8:
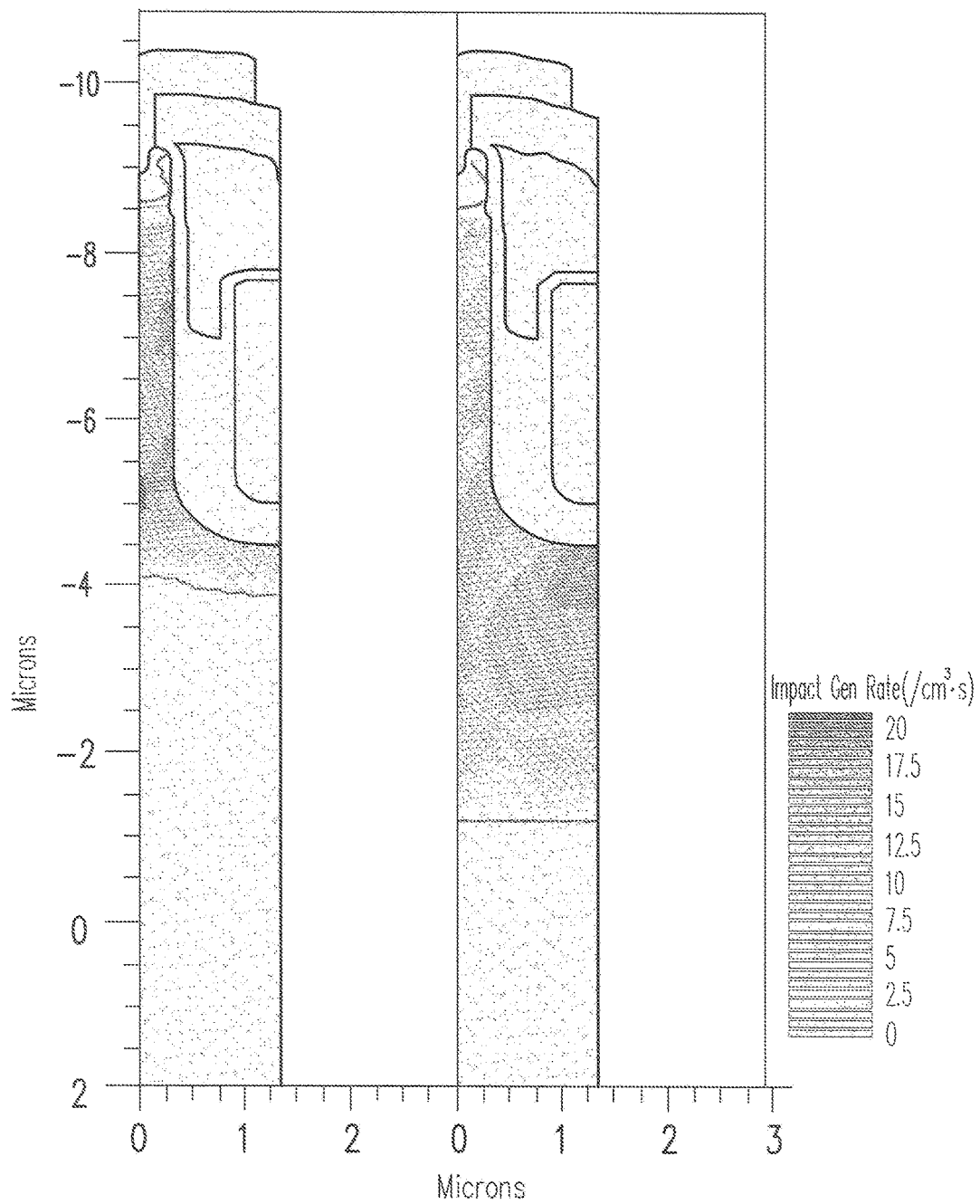
FIG. 8 shows graphs of impact generation rate of simulation target 1 and simulation target 2.

The left side of FIG. 8 is a graph of impact generation (Gen) rate of simulation target 2, and the right side of FIG. 8 is a graph of impact generation rate of simulation target 1. It can be known from FIG. 8 that, the impact generation rate of the split-gate MOSFET of the invention is more uniform.

Figure 9:
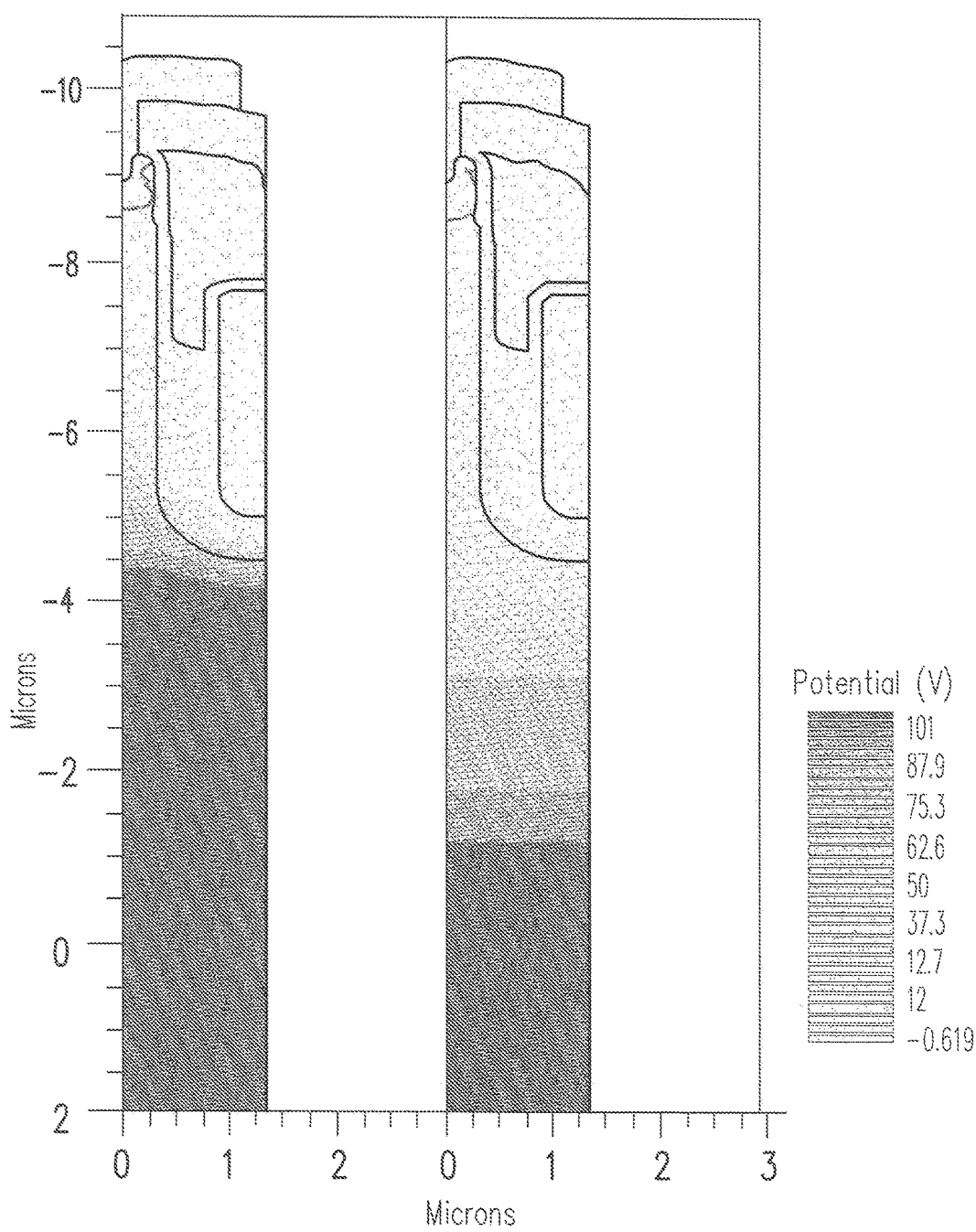
FIG. 9 shows graphs of the distribution of potential of simulation target 1 and simulation target 2.

The left side of FIG. 9 is a graph of the distribution of potential of simulation target 2, and the right side of FIG. 9 is a graph of the distribution of potential of simulation target 1. It can be known from FIG. 7 that, the split-gate MOSFET of the invention can withstand a higher electric potential.

Figure 10:
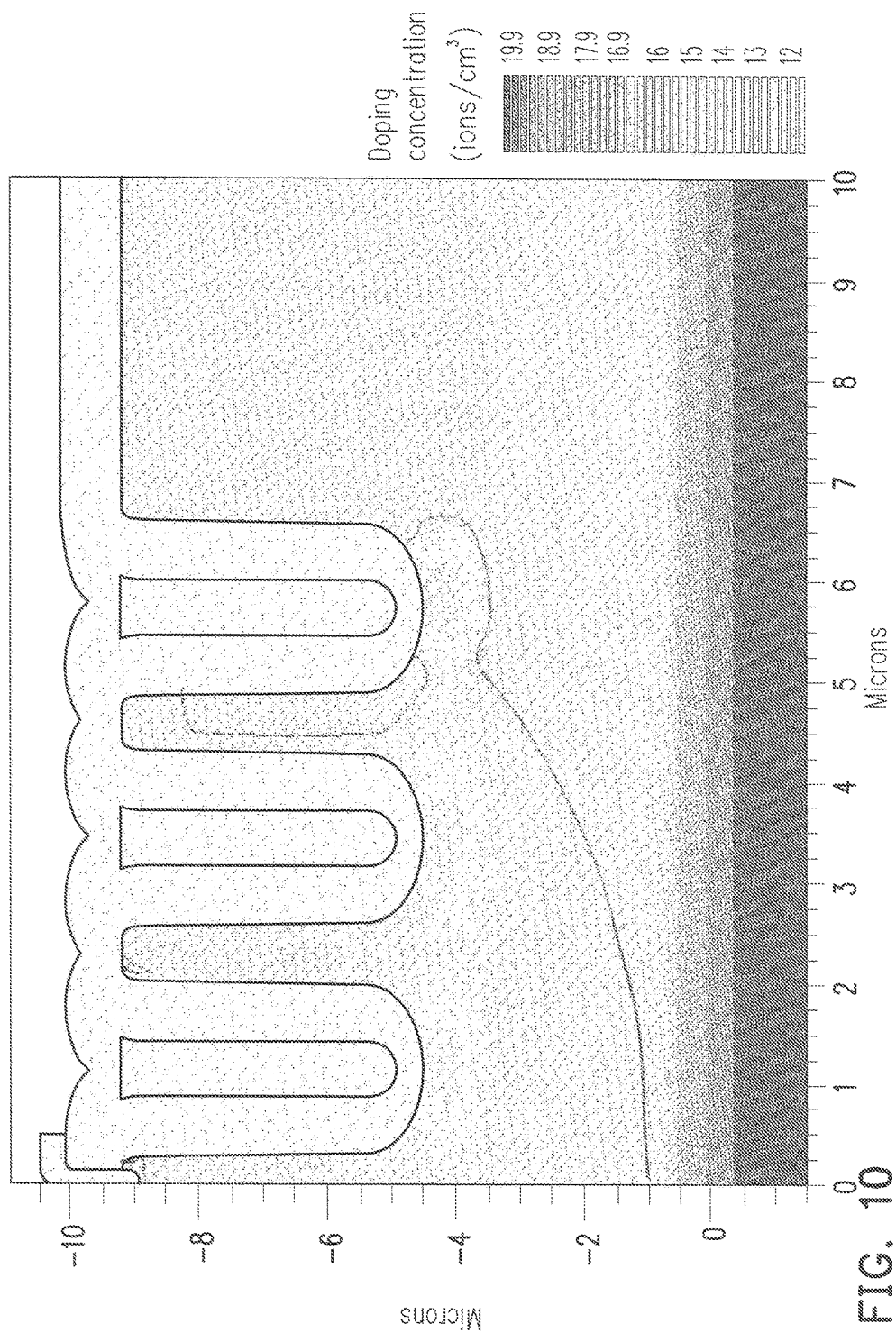
FIG. 10 is a graph of the distribution of doping concentration of simulation target 3.

FIG. 10 is a graph of the distribution of doping concentration of simulation target 3 (the numeric value in FIG. 10 is the value of n of 10"). It can be seen from FIG. 10 that, the bottom of the trench of the split-gate MOSFET of the invention has a region having lower doping concentration, and the doping concentration of the epitaxial layer close to the periphery of the trench is higher than the doping concentration of the epitaxial layer below the trench.

Figure 11:
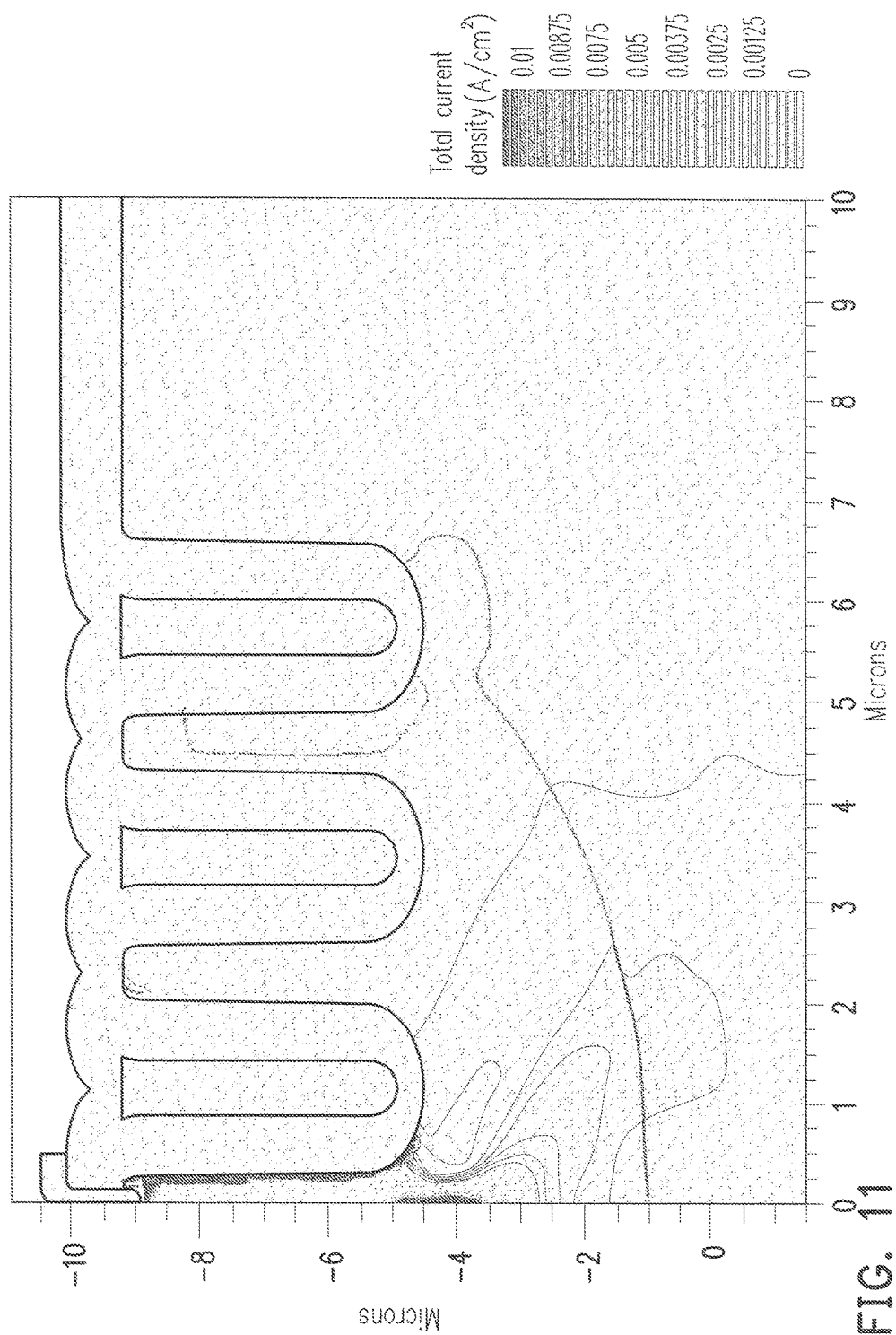
FIG. 11 is a graph of the distribution of total current density of simulation target 3.

FIG. 11 is a graph of the distribution of total current density of simulation target 3. It can be known from FIG. 11 that, the current density of the split-gate MOSFET of the invention is gradually reduced from the terminal region toward the edge.

Figure 12:
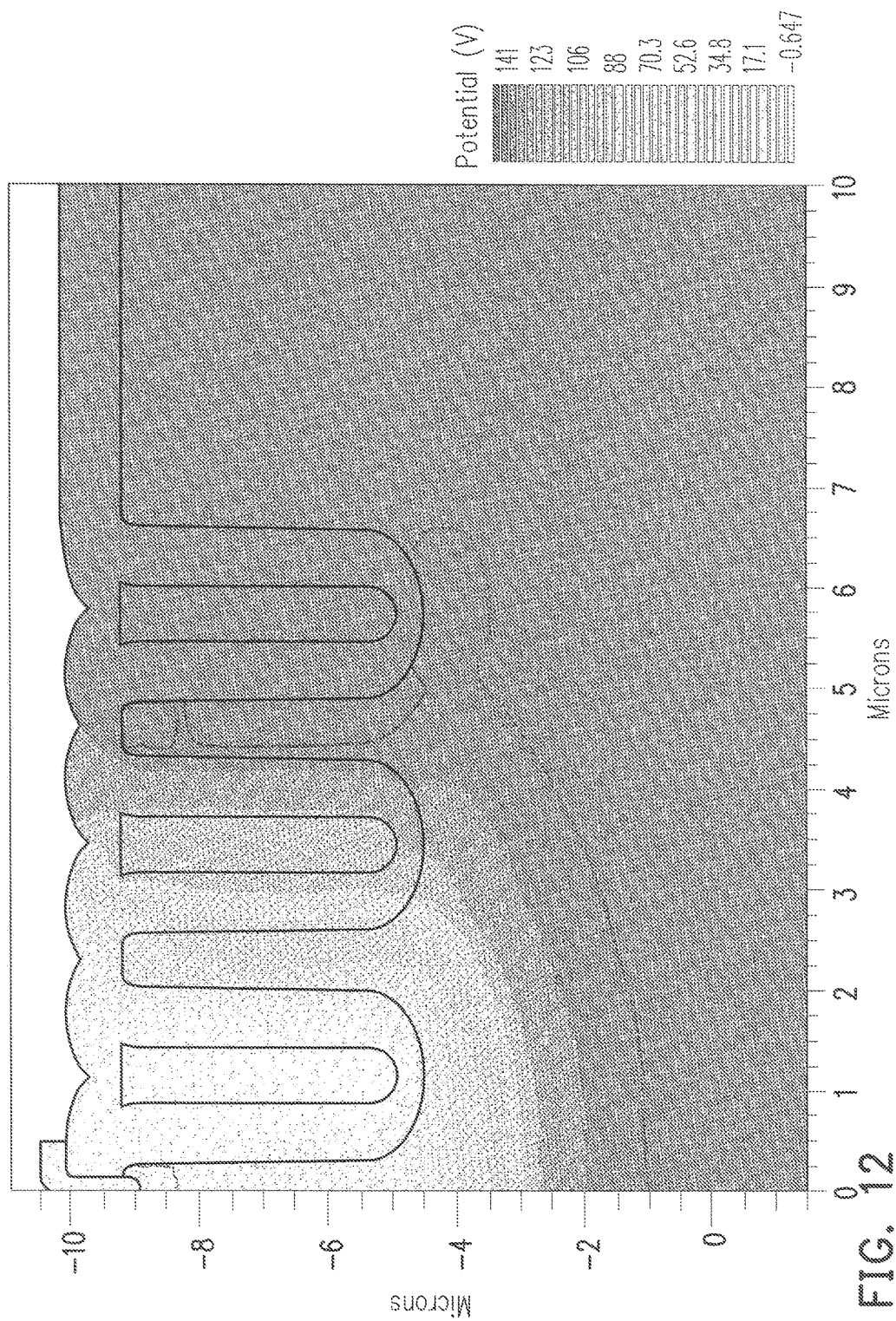
FIG. 12 is a graph of the distribution of potential of simulation target 3.

FIG. 12 is a graph of the distribution of potential of simulation target 3. It can be known from FIG. 12 that, the field of the terminal region of the split-gate MOSFET of the invention is reduced and extended to the edge, and withstands an electric potential reaching 150 V or above.

Based on the above, in the invention, the width of the depletion region for high-voltage application is maintained via the epitaxial layer having low doping concentration, and the resistance of the split-gate MOSFET is reduced via an epitaxial layer having high doping concentration, and at the same time, maximum electric field at the corners of the trench can be released in the implantation region having doping concentration at the bottom of the trench. Therefore, the split-gate MOSFET of the invention can achieve the effect of low on-resistance, application in a high voltage field of 100 V or above can be achieved without increasing the thickness of the trench oxide layer, the thickness of the trench oxide layer can be thin, and an additional lithography process is not needed.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A split-gate MOSFET at least having a terminal region and a cell region, comprising:
    a substrate;
    a first epitaxial layer formed on the substrate, wherein the first epitaxial layer has a first doping concentration;
    a second epitaxial layer formed on the first epitaxial layer, wherein the second epitaxial layer has a second doping concentration greater than the first doping concentration, a plurality of trenches is in the first epitaxial layer and the second epitaxial layer, and the plurality of trenches pass through the second epitaxial layer and is extended into the first epitaxial layer;
    a plurality of first gates respectively located within the plurality of trenches in the cell region;
    a plurality of second gates respectively located within the plurality of trenches on the first gate in the cell region;
    a plurality of third gates respectively located in the plurality of trenches in the terminal region, wherein the third gate closest to the cell region is grounded, and the rest of the plurality of third gates are floating gates;
    a gate oxide layer located between the first gate and the second gate and located between the second gate and the second epitaxial layer;
    a trench oxide layer located between the first gate and the first epitaxial layer and located between a surface of the plurality of trenches and the third gate in the terminal region; and
    a trench implantation region located in the first epitaxial layer at a bottom of each of the plurality of trenches in the terminal region and the cell region, wherein the trench implantation region has a third doping concentration less than the first doping concentration.

2. The split-gate MOSFET of claim 1, wherein the trench implantation region covers the bottom of each of the plurality of trenches.

3. The split-gate MOSFET of claim 1, wherein an interface of the first epitaxial layer and the second epitaxial layer is adjacent to the trench implantation region.

4. The split-gate MOSFET of claim 1, wherein an interface of the first epitaxial layer and the second epitaxial layer is in contact with the trench implantation region.

5. The split-gate MOSFET of claim 1, wherein a thickness of the gate oxide layer is less than a thickness of the trench oxide layer.

6. The split-gate MOSFET of claim 1, wherein a width of the second gate is greater than a width of the first gate.

7. The split-gate MOSFET of claim 1, wherein the second gate further comprises an extending portion extended to a sidewall of the first gate.

8. The split-gate MOSFET of claim 1, wherein a conductive state of the first epitaxial layer and the second epitaxial layer is n-type.

9. The split-gate MOSFET of claim 8, further comprising a p-type well located on the second epitaxial layer.

10. The split-gate MOSFET of claim 9, wherein an interface of the p-type well and the second epitaxial layer is adjacent to the gate oxide layer between the first gate and the second gate.

11. The split-gate MOSFET of claim 9, wherein the third gate closest to the cell region and the p-type well in the cell region are equipotential.

* * * * *